(12) United States Patent
Yamakawa

(10) Patent No.: US 7,696,685 B2
(45) Date of Patent: Apr. 13, 2010

(54) PHOSPHOR AND METHOD FOR PRODUCING SAME, AND LIGHT-EMITTING DEVICE USING SAME AND METHOD FOR MANUFACTURING SUCH DEVICE

(75) Inventor: Masahiko Yamakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 300 days.

(21) Appl. No.: 11/719,051

(22) PCT Filed: Nov. 8, 2005

(86) PCT No.: PCT/JP2005/020417

§ 371 (c)(1),
(2), (4) Date: May 10, 2007

(87) PCT Pub. No.: WO2006/051768

PCT Pub. Date: May 18, 2006

(65) Prior Publication Data

US 2008/0106185 A1    May 8, 2008

(30) Foreign Application Priority Data

Nov. 11, 2004   (JP) ............................. 2004-327261

(51) Int. Cl.
- *H01J 1/62* (2006.01)
- *C09K 11/70* (2006.01)
- *G01J 3/46* (2006.01)

(52) U.S. Cl. ............................... 313/503; 252/301.4 P; 445/3; 356/402

(58) Field of Classification Search ........... 252/301.4 P; 313/503

See application file for complete search history.

(56) References Cited

U.S. PATENT DOCUMENTS

| | | | |
|---|---|---|---|
| 2004/0007961 A1 | 1/2004 | Srivastava et al. | |
| 2004/0135154 A1 | 7/2004 | Doxsee et al. | |
| 2005/0212397 A1* | 9/2005 | Murazaki et al. | 313/487 |
| 2006/0164830 A1* | 7/2006 | Justel | 362/231 |

FOREIGN PATENT DOCUMENTS

| | | |
|---|---|---|
| JP | 10 102053 | 4/1998 |
| JP | 2002 348571 | 12/2002 |
| JP | 2004 175986 | 6/2004 |
| JP | 2004 203980 | 7/2004 |
| JP | 2004 269870 | 9/2004 |

* cited by examiner

*Primary Examiner*—Karabi Guharay
*Assistant Examiner*—Sheryl Hull
(74) *Attorney, Agent, or Firm*—Oblon, Spivak, McClelland, Maier & Neustadt, L.L.P.

(57) ABSTRACT

When a phosphor for ultraviolet excitation or visible light excitation is excited by light having wavelengths in a range of 100 to 500 nm and emission colors of the phosphor are represented by xy coordinates, the phosphor has a difference between a maximum value and a minimum value of x coordinates and a difference between a maximum value and a minimum value of y coordinates which are respectively 0.020 or less. A light-emitting device includes a light-emitting part which contains at least such a phosphor. The light-emitting part emits visible light when irradiated with ultraviolet or visible light emitted from an excitation source.

13 Claims, 1 Drawing Sheet

PHOSPHOR AND METHOD FOR PRODUCING SAME, AND LIGHT-EMITTING DEVICE USING SAME AND METHOD FOR MANUFACTURING SUCH DEVICE

This application is a 371 of PCT/JP05/20417, filed Nov. 8, 2005.

TECHNICAL FIELD

The present invention relates to an ultraviolet excitation type or visible light excitation type phosphor used for various types of light-emitting devices, a method for producing the phosphor, a light-emitting device using it, and a method for manufacturing the device.

BACKGROUND ART

In recent years, a light-emitting device using a phosphor, which is excited with ultraviolet or visible light, is spreading rapidly. Specific light-emitting devices include a plasma display panel (PDP), a cold cathode discharge lamp used for a back light or the like of a liquid crystal display, a white light-emitting type LED lamp (white LED lamp) using a light-emitting diode (LED), and the like. When the conventional heavily used fluorescent lamps are added to the above, demands for the ultraviolet excitation type or visible light excitation type phosphor are increasing rapidly. With the increase of such demands and use, the quality that the phosphor is demanded to have, particularly a life property (phosphor luminance maintenance property when operating), has become higher in level because the light-emitting device has become common and highly sophisticated.

The ultraviolet excitation type phosphor is made to emit visible light (so-called light emission) by irradiation of ultraviolet rays having various wavelengths. As an ultraviolet ray supply source, it is general to use rare gas discharge (wavelength: mainly 147 nm and 172 nm), mercury (wavelength: mainly 254 nm), black light (wavelength: mainly 360 nm), ultraviolet LED (wavelength: mainly 380 nm), and the like, which are selectively used depending on an applying device. For example, the rare gas discharge is used for the plasma display panel, the mercury is used for the cold cathode discharge lamp for the back light and the fluorescent lamp, and the ultraviolet LED (ultraviolet ray-emitting LED) is used for the white LED lamp.

The phosphor is made to emit light by ultraviolet rays having various wavelengths, and its light-emitting property is peculiar to the phosphor. For example, a red light-emitting $Y_2O_3$:Eu phosphor which is used for the cold cathode discharge lamp and the fluorescent lamp is made to emit light efficiently by ultraviolet rays of 147 nm, 172 nm and 254 nm but not made to emit light substantially by ultraviolet rays of 360 nm and 380 nm. A blue light-emitting $BaMgAl_{10}O_{17}$:Eu phosphor used for the plasma display panel is made to emit light efficiently by all ultraviolet rays of 147 nm, 172 nm, 254 nm, 360 nm and 380 nm.

As phosphor materials for the light-emitting device described above, phosphors of various compositions have been developed. For example, ultraviolet excitation type phosphors used for a plasma display panel, a rare gas discharge lamp and the like are described in Patent Reference 1 and Patent Reference 2. The phosphors described in these Patent Literatures were improved their compositions to improve an emission intensity and a luminescent maintenance factor. Specifically, Patent Literature 1 describes an ultraviolet excitation type phosphor having a luminance maintenance factor of 97% after a continuous light-emitting operation of 1000 hours.

In recent years, the light-emitting device is being used extensively in various fields, such as the back light of the plasma display panel and the liquid crystal display, and its use methods are becoming available in great variety. Therefore, there was conventionally no problem if the luminance maintenance factor after a continuous operation of about 1000 hours was excellent. But, a higher luminance maintenance factor is demanded in these years. Specifically, an excellent luminance maintenance factor is demanded even after a lapse of 3000 hours or more, e.g., about 5000 hours. However, the conventional phosphor does not always provide a luminance maintenance factor with a good result after a continuous operation for more than 3000 hours.

[Patent Reference 1] JP-A 2002-348571 (KOKAI)
[Patent Reference 2] JP-A 2004-203980 (KOKAI)

DISCLOSURE OF THE INVENTION

The present invention has been made in view of the above circumstances and provides a phosphor having an improved life property, which is represented by a luminance maintenance factor, after a long continuous operation, a method for producing the phosphor, a light-emitting device using it, and a method for producing the light-emitting device.

A phosphor according to an embodiment of the invention is a phosphor which is excited with ultraviolet or visible light, wherein when the phosphor is excited at wavelengths in a range of 100 to 500 nm and the emission colors are represented by xy coordinates, a difference between a maximum value and a minimum value of x coordinates and a difference between a maximum value and a minimum value of y coordinates are respectively 0.020 or less.

A method for producing a phosphor according to another embodiment of the invention includes exciting a phosphor at wavelengths in a range of 100 nm to 500 nm and measuring emission colors at individual wavelengths; and selecting a phosphor having a difference between a maximum value and a minimum value of x coordinates and a difference between a maximum value and a minimum value of y coordinates which are respectively 0.020 or less when the emission colors are represented by xy coordinates.

A light-emitting device according to still another embodiment of the invention includes an excitation source which emits ultraviolet or visible light; and a light-emitting part which is excited with the ultraviolet or visible light emitted from the excitation source to emit visible light and contains at least a phosphor having a difference between a maximum value and a minimum value of x coordinates and a difference between a maximum value and a minimum value of y coordinates which are respectively 0.020 or less when emission colors obtained by exciting at wavelengths in a range of 100 nm to 500 nm are represented by xy coordinates.

A method for producing a light-emitting device according to still another embodiment of the invention includes exciting a phosphor at wavelengths in a range of 100 to 500 nm and measuring emission colors at individual wavelengths; selecting a phosphor having a difference between a maximum value and a minimum value of x coordinates and a difference between a maximum value and a minimum value of y coordinates which are respectively 0.020 or less when the emission colors are represented by xy coordinates; and producing a light-emitting part which is excited with ultraviolet or visible light emitted from an excitation source to emit visible light by using at least the selected phosphor.

BRIEF DESCRIPTION OF THE DRAWINGS

FIG. 1 is a sectional diagram showing a structure of an LED lamp according to an embodiment of a light-emitting device of the present invention.

FIG. 2 is a partially sectional diagram showing a structure of a fluorescent lamp according to another embodiment of the light-emitting device of the present invention.

EXPLANATION OF REFERENCE NUMERALS

Figure 1:
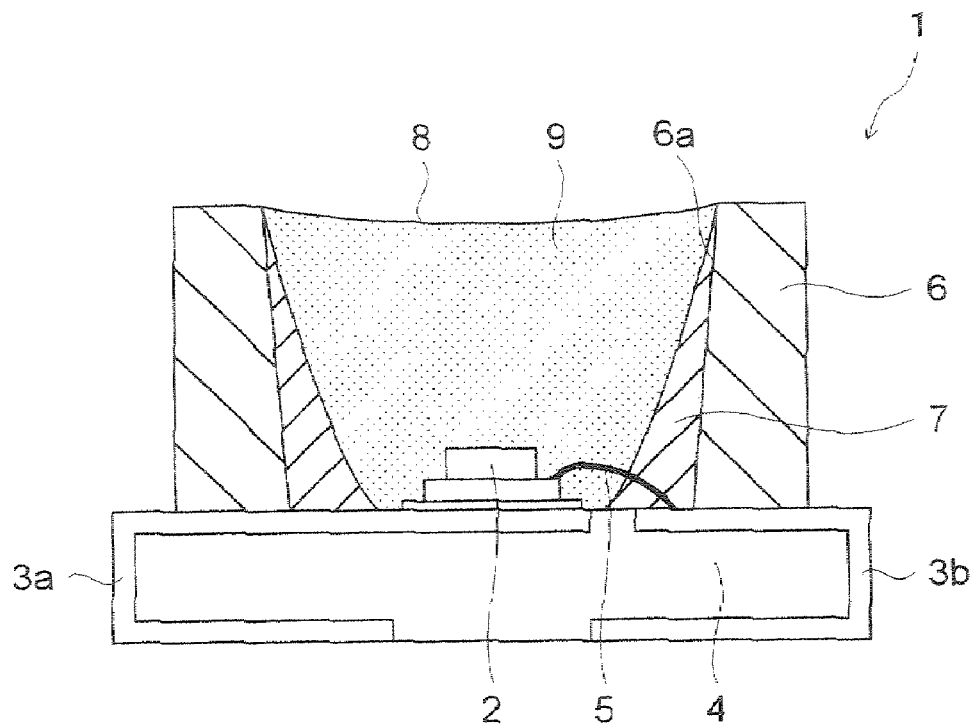
[FIG. 1]

1: LED lamp, 2: LED chip, 3: Lead terminal, 4: Substrate, 5: Bonding wire, 6: Resin frame, 7: Reflection layer, 8: Transparent resin, 9: Phosphor, 11: Fluorescent lamp, 12: Glass bulb, 13: Fluorescent film, 14: Stem part.

MODE FOR CARRYING OUT THE INVENTION

Modes of conducting the present invention will be described below with reference to the drawings. A phosphor according to an embodiment of the present invention is formed of a phosphor material which is excited with ultraviolet or visible light. An ultraviolet excitation type or visible light excitation type phosphor is not limited to a particular composition. An emission color is not limited to a particular color but may be any of red, blue and green emission colors. It may also be a yellow emission color depending on circumstances.

Various phosphors can be applied and they are, for example, a Eu-activated rare-earth oxide phosphor, a Eu-activated rare-earth oxysulfide phosphor, a Eu-activated rare-earth borate phosphor, a Eu-activated aluminate phosphor, a Eu-activated halophosphate phosphor, a Mn-activated zinc silicate phosphor, a Eu and Mn-activated aluminate phosphor, a Eu-activated alkaline-earth silicate phosphor, a Tb-activated rare-earth silicate phosphor, a Tb-activated rare-earth borate phosphor, a Tb-activated rare-earth phosphate phosphor, and the like. An activator is appropriately selected depending on the emission color. The phosphor may be either an ultraviolet excitation type or a visible light excitation type, and it is particularly effective for the ultraviolet excitation type phosphor using various wavelengths as an excitation source.

The phosphor of this embodiment satisfies that when the emission colors (the emission colors at the individual wavelengths) obtained by excitation at wavelengths in a range of 100 to 500 nm are represented on xy coordinates, a difference between a maximum value and a minimum value of x coordinates and a difference between a maximum value and a minimum value of y coordinates each are 0.020 or less. An excellent luminance maintenance factor can be obtained by the above phosphor. In other words, if the difference between the maximum value and the minimum value of the x coordinates and the difference between the maximum value and the minimum value of the y coordinates of the emission colors when excited at the wavelengths in the range of 100 to 500 nm without depending on the phosphor composition are 0.020 or less, a phosphor having an excellent luminance maintenance factor can be obtained.

As described above, the phosphor is excited at a particular wavelength depending on its composition and emits light. Therefore, the emission color was conventionally inspected only at the wavelength for excitation. But, a phosphor having a good property could not be necessarily extracted by the inspection of only a specified wavelength. For example, an ultraviolet excitation phosphor emits visible light having a wavelength corresponding to the energy level of an added activator as the irradiated ultraviolet rays are absorbed by phosphor particles, and energy conversion occurs within the particles. If the ultraviolet rays have a different wavelength, an excitation band within the absorbing phosphor or ultraviolet ray absorption positions within the particles, specifically a distance from the surface is different, and light emission from the activator is finally affected.

It was found that when ultraviolet rays having various wavelengths were irradiated by a light-emitting device, a phosphor having a good life property had the emission colors with less variation, and when ultraviolet rays having various wavelengths were irradiated, a phosphor having a poor life property had the emission colors with large variation. In other words, even if the phosphor excitation band or the ultraviolet ray absorption positions within the phosphor particles are changed, the phosphor which does not affect on a light-emitting property, namely an emission color, is presumably configured to have a stable crystal with less defects and a good life property. Conversely, if the phosphor excitation band or the ultraviolet ray absorption positions within the phosphor particles are changed, the phosphor which has a light-emitting property, namely an emission color, affected is presumably configured to have an instable crystal with many defects and a poor life property.

In addition, the phosphor is composed of various compounds such as a metal oxide, aluminate, borate and the like. Individual phosphors are prepared to have a desired composition ratio. A conventional phosphor was mainly prepared so to have a desired composition ratio. But, it was found that even if a real phosphor had the same composition ratio, there were variations in view of an atomic level such as a lattice constant or the like. In other words, it was found that a crystalline state was instable and had many defects.

The variation of the lattice constant means that when each of the phosphor particles is observed, for example, a lattice constant is different between the surface and the inside of the phosphor particle. And, it means that when the phosphor particles are compared with one another, the phosphors having variations in lattice constant are in a mutually mixed state even if they have the same composition ratio. It was found that where excitation light having a prescribed wavelength is irradiated to the phosphors in such a state, the individual phosphors had a different excited state (difference in excitation light absorbed state) because the lattice constant was different.

As described above, for evaluation of the property of the phosphor whose light-emitting property is affected by a crystalline state or the like, not only the emission color according to a single wavelength but also the emission colors according to a particular wavelength range (specifically, a range of 100 to 500 nm) are measured, and the difference between the maximum value and the minimum value of the x coordinates and the difference between the maximum value and the minimum value of the y coordinates of the emission colors at the individual wavelengths are significant. In other words, the emission colors are measured in a wide wavelength range of 100 to 500 nm, and if the difference between the maximum value and the minimum value of the x coordinates and the difference between the maximum value and the minimum value of the y coordinates at that time are respectively 0.020 or less, indicating a small variation, a good luminance maintenance factor can be obtained.

In other words, if either of the difference between the maximum value and the minimum value of the x coordinates and the difference between the maximum value and the minimum value of the y coordinates of the above-described emission color exceeds 0.020, it means that the phosphor has variations in the inner structure which is based on the crystalline state, the lattice constant and the like. Such a defect degrades the luminance maintenance factor. The reason of selecting the range of 100 to 500 nm as wavelengths used for the evaluation of the phosphor properties is because the ultraviolet rays and visible light have a wavelength including the above range. In other words, the phosphor which is excited by the ultraviolet or visible light includes all excitation wavelengths, so that the wavelengths in the range of 100 to 500 nm are used.

For example, the phosphor of this embodiment is produced as follows. First, the phosphor is excited with a wavelength varied in a range of 100 to 500 nm, and the emission color of the phosphor is measured by a method according to the CIE chromaticity coordinates. The emission colors of the phosphor at the individual wavelengths are determined as xy coordinates. The measurement wavelengths are selected from, for example, 100 nm, 150 nm, 200 nm, . . . , 500 nm on a 50-nm basis. The measurement wavelength may be selected on a smaller wavelength basis, but a phosphor life property can be evaluated sufficiently by selecting the measurement wavelength from the range of 100 to 500 nm on the 50-nm basis.

The maximum value and the minimum value of the x coordinates are determined from the emission colors (xy coordinate values) of the phosphor measured by the above-described method to obtain a difference between these values (the difference between the maximum value and the minimum value of the x coordinates is referred to as difference (A)). Similarly, the maximum value and the minimum value of the y coordinates are determined to obtain a difference between these values (the difference between the maximum value and the minimum value of the y coordinates is referred to as difference (B)). According to the obtained results, phosphors having both the difference (A) of the x coordinate and the difference (B) of the y coordinate of 0.020 or less are selected. The selected phosphors indicate a good luminance maintenance factor regardless of their compositions.

According to the above-described method for producing a phosphor, the phosphor having a good luminance maintenance factor can be obtained regardless of the composition of the phosphor. In addition, when a conventional phosphor was applied to a light-emitting device, a life property was unknown until it was incorporated into the light-emitting device. But, the application of the production method of this embodiment allows to evaluate and inspect the phosphor powder for its property. It greatly contributes to provision of a light-emitting device with a long life and improved reliability. Measurement of the emission color of the phosphor (phosphor inspection) may be conducted on each phosphor particle or on about 0.1 to 5 kg of phosphor particles.

The phosphor of this embodiment can be obtained on the basis of the above-described selection process. In addition, to produce the phosphor of this embodiment, the production process described below can be applied effectively to suppress variations in the crystalline structure of the phosphor. Specifically, causes of variations in crystalline structure such as a lattice constant of the phosphor are various and include unevenness of raw material powder, variations in the preparing process and others. For example, the purity and particle diameter of the raw material powder, and the firing temperature and time at the time of preparation have been controlled conventionally. But, it was found that such procedures were insufficient.

To fire the phosphor, several kilograms of raw material powders are mixed at a time, and the mixture is fired in a firing crucible. Even if the same firing temperature and time are applied for firing, heat quantity transmitted into the crucible is variable. If the heat quantity transmitted into the crucible is variable, the transmitted heat quantity is different between the phosphor near the inside wall of the crucible and the phosphor near the center of the crucible. Therefore, even if phosphors are prepared at the same composition ratio, they have variations in view of the atomic level such as a lattice constant. The difference in lattice constant can also be checked by TEM observation.

To produce the phosphor of this embodiment, it is desirable that the heat conduction within the crucible is made uniform in order to suppress the above-described variation. Specifically, a crucible having good heat conductivity should be used, and an amount of raw material powder to be charged into the crucible should be determined to be ½ or less of the crucible volume. The crucible having good heat conductivity includes a crucible made of a high-melting metal such as tungsten, molybdenum or tantalum, or an alloy of them. And, since the raw material powder to be charged into the crucible is determined to be ½ or less of the crucible volume, the heat conduction on the side of the inside wall and the center of the crucible can be made uniform, and generation of uneven firing can be suppressed.

The phosphor according to the embodiment of the present invention is suitable for phosphors configuring a light-emitting part of a light-emitting device. To produce the light-emitting device, the phosphor of this embodiment is desirably applied to all the phosphors configuring the light-emitting part, but the phosphor of this embodiment can be used in combination with another phosphor (phosphor which is not included in the scope of the present invention). In a case where plural types of phosphor powders are used in combination as a group of phosphors, the life property of the light-emitting device can be improved when the phosphor powder of this embodiment is contained in 70 mass % or more within all the phosphors.

Then, an embodiment of the light-emitting device according to the invention will be described. The light-emitting device according to the embodiment of the invention has an excitation source which emits ultraviolet or visible light, and a light-emitting part which is excited by the ultraviolet or visible light emitted from the excitation source and emits visible light. This light-emitting part is configured of the phosphor of this embodiment or a group of phosphors having the phosphor of this embodiment combined with another phosphor. Specific examples of the above light-emitting device include a fluorescent lamp, a cold cathode discharge lamp, a plasma display, an LED lamp and the like. For the excitation source of the LED lamp, a light-emitting semiconductor device such as an LED chip, a laser diode (semiconductor laser) or the like is used. Therefore, the LED lamp can also be called as a semiconductor lamp.

FIG. 1 is a sectional diagram showing a structure of an embodiment applying the light-emitting device of the present invention to an LED lamp. A light-emitting device (LED lamp) 1 shown in FIG. 1 has an LED chip 2 as an excitation source. The excitation source of the light-emitting device 1 is not limited to the LED chip 2 but may be a laser diode (semiconductor laser) or the like. The LED chip 2 is mounted on a substrate 4 which has a pair of lead terminals 3a, 3b. The lower electrode of the LED chip 2 is electrically an d mechanically connected to the lead terminal 3a. The upper electrode of the LED chip 2 is electrically connected to the lead terminal 3b through a bonding wire 5.

For the LED lamp 1, a light source which emits, for example, ultraviolet light is used as an excitation source. Therefore, the LED chip 2 which emits ultraviolet light is used as the excitation source. The LED chip 2 of an ultraviolet emission type has typically a light emission wavelength in a range of 360 to 420 nm. As the ultraviolet emission LED chip 2, an LED chip having a light-emitting layer which is formed of a nitride-based compound semiconductor layer is exemplified. The light emission wavelength of the LED chip 2 is sufficient if a target emission color can be obtained on the basis of a combination with the phosphor. Therefore, the LED chip 2 is not necessarily limited to an LED chip having the light emission wavelength in a range of 360 to 420 nm. A light-emitting semiconductor device (such as a laser diode) may be used in addition to the LED chip as the excitation source.

A cylindrical resin frame 6 is disposed on a substrate 4, and a reflection layer 7 is formed on its inner wall surface 6a. The resin frame 6 is filled with a transparent resin 8, and the LED chip 2 is embedded in the transparent resin 8. The LED chip 2 is covered with the transparent resin 8. The transparent resin 8 where the LED chip 2 is embedded contains an ultraviolet excitation type phosphor 9. The phosphor 9 dispersed in the transparent resin 8 emits light which is emitted from the LED chip 2. For example, it is excited by ultraviolet light to emit visible light.

The transparent resin 8 containing the phosphor 9 functions as a light-emitting part and is disposed at the front of the light emitting direction of the LED chip 2. For example, a silicone resin, an epoxy resin or the like is used for the transparent resin 8. The above-described phosphor or group of phosphors is used as the phosphor 9 configuring the light-emitting part. The phosphor and the group of phosphors of the above-described embodiment have an excellent life property (luminance maintenance factor), so that the service life of the light-emitting device can be made long. Especially, when a long continuous operation, for example, a continuous operation of 3000 hours or more, and 5000 hours or more, is performed, the luminance of the light-emitting device (LED lamp 1) can be suppressed from degrading. In other words, it is suitable for a light-emitting device which is kept on at all times.

The type or combination of the phosphors 9 dispersed in the transparent resin 8 is appropriately selected depending on the emission color of the target LED lamp 1 and not particularly limited. For example, where the LED lamp 1 is used as a white light-emitting LED lamp (white LED lamp), a mixture of a blue light-emitting phosphor, a green light-emitting phosphor and a red light-emitting phosphor is used. To obtain an emission color other than white, one phosphor or a combination of two or more phosphors can be used among the blue light-emitting phosphor, the green light-emitting phosphor and the red light-emitting phosphor.

Figure 2:
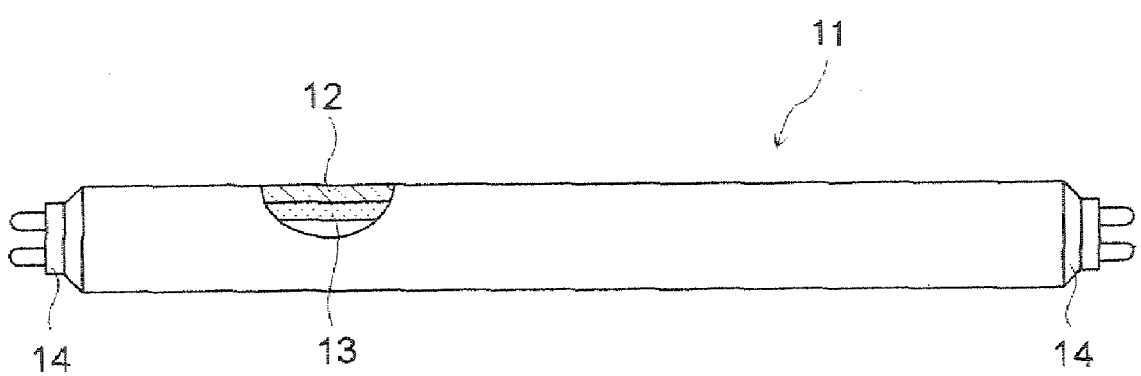
[FIG. 2]

FIG. 2 is a diagram showing a structure of an embodiment applying the light-emitting device of the invention to a fluorescent lamp. A fluorescent lamp 11 shown in FIG. 2 is provided with a glass bulb 12. A fluorescent film 13 is formed on the inner surface of the glass bulb 12. This fluorescent film 13 contains the phosphor or group of phosphors of the above-described embodiment. Specifically, the fluorescent film 13 containing the phosphor or group of phosphors of the above-described embodiment is formed to adhere to the inner surface of the glass bulb 12 as a fluorescent lamp phosphor such as a three wavelength type phosphor. The fluorescent film 13 configures the light-emitting part.

As an electrode sealing part, a stem part 14 seals each end of the glass bulb 12. A prescribed amount of mercury and a prescribed pressure of rare gas are sealed as a discharge gas into the glass bulb 12 to configure the fluorescent lamp 11. The fluorescent lamp 11 mainly provides visible light by applying a prescribed voltage to the electrodes at the both ends to generate positive column discharge and exciting the fluorescent film 13 by the ultraviolet rays generated by the discharge. In other words, the mercury sealed within the glass bulb 12 becomes the excitation source of the fluorescent film 13.

In the fluorescent lamp 11 of the embodiment described above, the phosphor configuring the fluorescent film 13 has an excellent life property (luminance maintenance factor), so that the service life of the fluorescent lamp 11 can also be extended. Especially, in a case where a long continuous operation, for example, a continuous operation of 3000 hours or more, and further 5000 hours or more, is performed, the luminance of the fluorescent lamp 11 can be suppressed from degrading. The effect of improving the service life of the light-emitting device is not limited to the LED lamp 1 and the fluorescent lamp 11 but can also be obtained for a plasma display (PDP) and a cold cathode discharge lamp.

Then, specific examples of the invention and the evaluated results will be described below.

[Samples 1 to 36]

First, phosphors having the compositions shown in Tables 1 to 3 each were prepared in 1 kg. Then, the x coordinate and the y coordinate of each of the emission colors obtained by exciting at wavelengths in a range of 100 to 500 nm were measured, and the difference (A) between the maximum value and the minimum value of the x coordinates and the difference (B) between the maximum value and the minimum value of the y coordinates were determined. The measurement wavelengths were selected from a range of 100 to 500 nm on a 50-nm basis. The phosphors having the difference (A) of the x coordinate and the difference (B) of the y coordinate of 0.020 or less were selected as the phosphor according to the embodiment of the present invention. Phosphors having the difference (A) of the x coordinate and the difference (B) of the y coordinate of exceeding 0.020 were determined as comparative examples.

The phosphors of the individual examples and comparative examples were used to produce the light-emitting devices shown in Tables 1 to 3. The light-emitting parts of the individual light-emitting devices were produced by using 100% of the phosphors of the individual examples and comparative examples. Luminance maintenance factors of the individual light-emitting devices were measured. As to the luminance maintenance factor, light emission luminance $L_0$ at initial light emission, light emission luminance $L_1$ after 1000-hour continuous light emission, and light emission luminance $L_2$ after 5000-hour continuous light emission were measured. With the initial light emission luminance $L_0$ determined as 100, a ratio between the light emission luminance $L_1$ and the light emission luminance $L_2$ was determined for the individual phosphors. The obtained values are shown in Tables 1 to 3.

TABLE 1

| | | Phosphor | ECD | Light-emitting device | | |
|---|---|---|---|---|---|---|
| | Sample No. | Composition | Top: D(A) Bottom: D(B) | Device | LMF $L_1/L_0$ | LMF $L_2/L_0$ |
| E1 | 1 | $(Ba, Sr)MgAl_{10}O_{17}:Eu$ | 0.015 0.013 | Fluorescent lamp | 95 | 91 |
| E2 | 2 | $(Ba, Sr)MgAl_{10}O_{17}:Eu$ | 0.015 0.013 | Cold cathode lamp | 94 | 90 |
| E3 | 3 | $(Ba, Sr)MgAl_{10}O_{17}:Eu$ | 0.015 0.013 | PDP | 90 | 88 |
| E4 | 4 | $(Ba, Sr)MgAl_{10}O_{17}:Eu$ | 0.015 0.013 | White LED | 98 | 95 |
| CE1 | 5 | $(Ba, Sr)MgAl_{10}O_{17}:Eu$ | 0.033 0.025 | Fluorescent lamp | 89 | 81 |
| CE2 | 6 | $(Ba, Sr)MgAl_{10}O_{17}:Eu$ | 0.033 0.025 | Cold cathode lamp | 87 | 80 |
| CE3 | 7 | $(Ba, Sr)MgAl_{10}O_{17}:Eu$ | 0.033 0.025 | PDP | 82 | 65 |
| CE4 | 8 | $(Ba, Sr)MgAl_{10}O_{17}:Eu$ | 0.033 0.025 | White LED | 90 | 82 |
| E5 | 9 | $(Sr, Ca, Ba)_{10}(PO_4)_6Cl_2:Eu$ | 0.011 0.009 | Fluorescent lamp | 96 | 92 |
| E6 | 10 | $(Sr, Ca, Ba)_{10}(PO_4)_6Cl_2:Eu$ | 0.011 0.009 | Cold cathode lamp | 95 | 90 |
| CE5 | 11 | $(Sr, Ca, Ba)_{10}(PO_4)_6Cl_2:Eu$ | 0.025 0.028 | Fluorescent lamp | 91 | 88 |
| CE6 | 12 | $(Sr, Ca, Ba)_{10}(PO_4)_6Cl_2:Eu$ | 0.025 0.028 | Cold cathode lamp | 90 | 88 |

E = Example;
CE = Comparative Example;
ECD = Emission Color Difference;
D = Difference;
LMF = Luminance Maintenance Factor

TABLE 2

| | | Phosphor | ECD | Light-emitting device | | |
|---|---|---|---|---|---|---|
| | Sample No. | Composition | Top: D(A) Bottom: D(B) | Device | LMF $L_1/L_0$ | LMF $L_2/L_0$ |
| E7 | 13 | $LaPO_4:Ce, Tb$ | 0.011 0.009 | Fluorescent lamp | 96 | 91 |
| E8 | 14 | $LaPO_4:Ce, Tb$ | 0.011 0.009 | Cold cathode lamp | 95 | 90 |
| CE7 | 15 | $LaPO_4:Ce, Tb$ | 0.027 0.025 | Fluorescent lamp | 87 | 80 |
| CE8 | 16 | $LaPO_4:Ce, Tb$ | 0.027 0.025 | Cold cathode lamp | 85 | 78 |
| E9 | 17 | $Zn_2SiO_4:Mn$ | 0.011 0.010 | PDP | 91 | 88 |
| CE9 | 18 | $Zn_2SiO_4:Mn$ | 0.030 0.025 | PDP | 80 | 70 |
| E10 | 19 | $(Ba, Sr)MgAl_{10}O_{17}:Eu, Mn$ | 0.015 0.013 | Fluorescent lamp | 94 | 90 |
| E11 | 20 | $(Ba, Sr)MgAl_{10}O_{17}:Eu, Mn$ | 0.015 0.013 | Cold cathode lamp | 93 | 89 |
| E12 | 21 | $(Ba, Sr)MgAl_{10}O_{17}:Eu, Mn$ | 0.015 0.013 | PDP | 90 | 85 |
| E13 | 22 | $(Ba, Sr)MgAl_{10}O_{17}:Eu, Mn$ | 0.015 0.013 | White LED | 97 | 92 |

TABLE 2-continued

| Sample No. | Composition | Phosphor ECD Top: D(A) Bottom: D(B) | Light-emitting device Device | LMF $L_1/L_0$ | LMF $L_2/L_0$ |
|---|---|---|---|---|---|
| CE10 | 23 | (Ba, Sr)MgAl$_{10}$O$_{17}$:Eu, Mn | 0.015 0.013 | Fluorescent lamp | 87 | 76 |
| CE11 | 24 | (Ba, Sr)MgAl$_{10}$O$_{17}$:Eu, Mn | 0.015 0.013 | Cold cathode lamp | 85 | 75 |

E = Example;
CE = Comparative Example;
ECD = Emission Color Difference;
D = Difference;
LMF = Luminance Maintenance Factor

TABLE 3

| Sample No. | Composition | Phosphor ECD Top: D(A) Bottom: D(B) | Light-emitting device Device | LMF $L_1/L_0$ | LMF $L_2/L_0$ |
|---|---|---|---|---|---|
| CE12 | 25 | (Ba, Sr)MgAl$_{10}$O$_{17}$:Eu, Mn | 0.033 0.025 | PDP | 81 | 62 |
| CE13 | 26 | (Ba, Sr)MgAl$_{10}$O$_{17}$:Eu, Mn | 0.033 0.025 | White LED | 89 | 80 |
| E14 | 27 | Y$_2$O$_3$:Eu | 0.008 0.010 | Fluorescent lamp | 96 | 92 |
| E15 | 28 | Y$_2$O$_3$:Eu | 0.008 0.010 | Cold cathode lamp | 96 | 92 |
| CE14 | 29 | Y$_2$O$_3$:Eu | 0.025 0.027 | Fluorescent lamp | 89 | 80 |
| CE15 | 30 | Y$_2$O$_3$:Eu | 0.025 0.027 | Cold cathode lamp | 88 | 79 |
| E16 | 31 | (Y, Gd)BO$_3$:Eu | 0.010 0.011 | PDP | 98 | 90 |
| CE16 | 32 | (Y, Gd)BO$_3$:Eu | 0.028 0.023 | PDP | 90 | 81 |
| E17 | 33 | Y$_2$O$_2$S:Eu | 0.009 0.010 | White LED | 97 | 92 |
| CE17 | 34 | Y$_2$O$_2$S:Eu | 0.027 0.025 | White LED | 90 | 81 |
| E18 | 35 | La$_2$O$_2$S:Eu | 0.010 0.012 | White LED | 98 | 93 |
| CE18 | 36 | La$_2$O$_2$S:Eu | 0.025 0.023 | White LED | 90 | 84 |

E = Example;
CE = Comparative Example;
ECD = Emission Color Difference;
D = Difference;
LMF = Luminance Maintenance Factor It is seen that the light-emitting devices of the individual examples have an excellent luminance maintenance factor after 1000 hours and 5000 hours. Meanwhile, the light-emitting devices of the comparative examples have largely degraded luminance. It is seen from the results that the phosphors of the individual embodiments having the difference (A) of the x coordinate and the difference (B) of the y coordinate of 0.020 or less have excellent properties though they have the same compositions as those of the comparative examples. Thus, the application of the producing method (inspection method) of the present invention can extract only phosphors having good properties.

[Samples 37 to 49]

Then, examinations were performed with the ratio (mass %) of phosphors varied. Phosphor (I) having both the difference (A) of the x coordinate and the difference (B) of the y coordinate of 0.020 or less and phosphor (II) having both the above values of 0.025 were prepared. The phosphor (I) and the phosphor (II) were mixed at the individual ratios (mass %) shown in Table 4 to apply to the light-emitting device. Then, $L_1/L_0$ and $L_2/L_0$ were measured and evaluated according to the method described above. A (Ba, Sr)MgAl$_{10}$O$_{17}$:Eu phosphor was used for the individual phosphor samples.

TABLE 4

| Sample No. | Ratio of Phosphor I:Phosphor II (mass %) | Light-emitting device Device | LMF $L_1/L_0$ | LMF $L_2/L_0$ |
|---|---|---|---|---|
| 37 | 100:0 | FL | 95 | 91 |
| 38 | 90:10 | FL | 94 | 90 |
| 39 | 80:20 | FL | 94 | 90 |
| 40 | 70:30 | FL | 93 | 89 |
| 41 | 60:40 | FL | 93 | 88 |
| 42 | 50:50 | FL | 92 | 87 |
| 43 | 100:0 | White LED | 98 | 95 |
| 44 | 90:10 | White LED | 98 | 94 |
| 45 | 80:20 | White LED | 97 | 93 |
| 46 | 70:30 | White LED | 97 | 92 |
| 47 | 60:40 | White LED | 96 | 91 |
| 48 | 50:50 | White LED | 95 | 90 |

LMF = Luminance Maintenance Factor;
FL = Fluorescent Lamp

It is apparent from Table 4 that the service life (luminance maintenance factor) of the light-emitting device can be improved by configuring the light-emitting part by a phosphor containing 70 mass % or more of the phosphor having both the difference (A) of the x coordinate and the difference (B) of the y coordinate of 0.020 or less.

INDUSTRIAL APPLICABILITY

The phosphor and the light-emitting device using it of the present invention have an excellent life property. And, the producing method of the present invention can provide the phosphor and the light-emitting device each having an excellent life property with a good reproducibility. Thus, the present invention is useful for various types of light-emitting devices.

What is claimed is:

1. A testing method, comprising:
   exciting a phosphor at each of the following wavelengths: 100 nm, 150 nm, 200 nm, 250 nm, 300 nm, 350 nm, 400 nm and 500 nm;
   measuring emission colors of the phosphor excited at the individual wavelengths wherein the emission colors are represented by xy coordinates; and
   selecting a phosphor based on the measured emission colors having a difference between a maximum value and a minimum value of the x coordinates and a difference between a maximum value and a minimum value of the y coordinates which are respectively 0.020 or less as a phosphor for use in a light-emitting device.

2. A light-emitting device, comprising:
   an excitation source which emits ultraviolet or visible light; and
   a light-emitting part which is excited by the ultraviolet or visible light emitted from the excitation source to emit visible light and comprising at least the phosphor selected for use in a light-emitting device by the testing method according to claim 1.

3. The light-emitting device according to claim 2, wherein the light-emitting part comprises the selected phosphor in a range of 70 mass% or more of all phosphors.

4. The light-emitting device according to claim 2, wherein the light-emitting device is one selected from a fluorescent lamp, a cold cathode discharge lamp, a plasma display and an LED lamp.

5. The light-emitting device according to claim 2, wherein the light-emitting device is a white light-emitting LED lamp.

6. The testing method according to claim 1, wherein the phosphor is a europium-activated rare-earth oxide phosphor, a europium-activated rare-earth oxysulfide phosphor, a europium-activated rare-earth borate phosphor, a europium-activated aluminate phosphor, a europium-activated halophosphate phosphor, a manganese-activated zinc silicate phosphor, a europium and manganese-activated aluminate phosphor, a europium-activated alkaline-earth silicate phosphor, a terbium-activated rare-earth silicate phosphor, a terbium-activated rare-earth borate phosphor, or a terbium-activated rare-earth phosphate phosphor.

7. The testing method according to claim 1, comprising:
   selecting a phosphor based on the measured emission colors having a difference between a maximum value and a minimum value of the x coordinates and a difference between a maximum value and a minimum value of the y coordinates which are respectively 0.015 or less as a phosphor for use in a light-emitting device.

8. A light-emitting device, comprising:
   an excitation source which emits ultraviolet or visible light; and
   a light-emitting part which is excited by the ultraviolet or visible light emitted from the excitation source to emit visible light and comprising at least the phosphor selected for use in a light-emitting device by the testing method according to claim 7.

9. A method for producing a light-emitting device, comprising:
   exciting a phosphor at each of the following wavelengths: 100 nm, 150 nm, 200 nm, 250 nm, 300 nm, 350 nm, 400 nm and 500 nm;
   measuring emission colors of the phosphor excited at the individual wavelengths, wherein the emission colors are represented by xy coordinates; and
   based on the measured emission colors, if the phosphor has a difference between a maximum value and a minimum value of the x coordinates and a difference between a maximum value and a minimum value of the y coordinates which are respectively 0.020 or less; then
   producing a light-emitting part which is excited by ultraviolet or visible light emitted from an excitation source to emit visible light using the phosphor.

10. The method for producing the light-emitting device according to claim 9,
    wherein the light-emitting part contains the phosphor in 70 mass% or more of all phosphors.

11. The method for producing the light-emitting device according to claim 9,
    wherein the light-emitting device is one selected from a fluorescent lamp, a cold cathode discharge lamp, a plasma display and an LED lamp.

12. The method for producing the light-emitting device according to claim 9, wherein the light-emitting device is a white light-emitting LED lamp.

13. The method for producing the light-emitting device according to claim 9,
    wherein the phosphor is a europium-activated rare-earth oxide phosphor, a europium-activated rare-earth oxysulfide phosphor, a europium-activated rare-earth borate phosphor, a europium-activated aluminate phosphor, a europium-activated halophosphate phosphor, a manganese-activated zinc silicate phosphor, a europium and manganese-activated aluminate phosphor, a europium-activated alkaline-earth silicate phosphor, a terbium-activated rare-earth silicate phosphor, a terbium-activated rare-earth borate phosphor, or a terbium-activated rare-earth phosphate phosphor.

* * * * *